(12) United States Patent
Wang et al.

(10) Patent No.: US 7,940,108 B1
(45) Date of Patent: May 10, 2011

(54) VOLTAGE LEVEL SHIFTER

(75) Inventors: Guang-Cheng Wang, Zhubei (TW);
Ta-Pen Guo, Cupertino, CA (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 12/692,884

(22) Filed: Jan. 25, 2010

(51) Int. Cl.
*H03L 5/00* (2006.01)
(52) U.S. Cl. .............................. 327/333; 326/62; 326/81
(58) Field of Classification Search .............. 326/80–81, 326/62–63; 327/306, 333
See application file for complete search history.

(56) References Cited

U.S. PATENT DOCUMENTS

| | | | |
|---|---|---|---|
| 7,129,752 B2* | 10/2006 | Bayer | 326/68 |
| 7,151,391 B2 | 12/2006 | Chen et al. | |
| 7,199,617 B1* | 4/2007 | Schrom et al. | 326/86 |
| 7,199,639 B2* | 4/2007 | Kanno et al. | 327/333 |
| 2006/0139086 A1* | 6/2006 | Heinz et al. | 327/333 |

* cited by examiner

*Primary Examiner* — Dinh T. Le
(74) *Attorney, Agent, or Firm* — Duane Morris LLP

(57) ABSTRACT

A circuit, includes first, second, and third inverters. The first inverter has a first input coupled to a first port and a first output coupled to a second port. The second inverter has a second input coupled to the second port and a second output coupled to the first port. The third inverter has a third input coupled to the first port through a first capacitor and to a third port. The third inverter has an output coupled to the second port through a second capacitor. The circuit receives a signal having a voltage between a first voltage potential and a second voltage potential and in response outputs a signal having a voltage between the second voltage potential and a third voltage potential. The third voltage potential is higher than the first and second voltage potentials with respect to ground.

20 Claims, 3 Drawing Sheets

VOLTAGE LEVEL SHIFTER

FIELD OF DISCLOSURE

The disclosed system relates to voltage level shifting circuits for integrated circuits.

BACKGROUND

Integrated circuits (ICs) continue to shrink in size and in the amount of power they consume. The reduction in power consumption is achieved in part by lowering the core operating voltage of the ICs. For example, core voltages for ICs with low power consumption may be approximately 1 V to 1.8V. However, these low power ICs are sometimes interfaced with circuits having operating voltages that are approximately twice the operating voltages of the low-power circuits.

Voltage level shifters are frequently used as an interface between the ICs having low operating voltages and ICs having higher operating voltages. The voltage shifters are typically fabricated using devices that operate at the low power levels. One example of a conventional level shifter is illustrated in FIG. 1A. As shown in FIG. 1A, the conventional level shifter 100 includes PMOS transistors 102, 104, 106, and 108; NMOS transistors 110, 112, 114, and 116; and an inverter 118. PMOS transistors 102 and 104 are cross-coupled with each other and are coupled to PMOS transistors 106, 108 at nodes 124 and 126. Node 126 is also coupled to an input/output (I/O) port 122, which may be coupled to a post-driver circuit (not shown) having an operating voltage $V_{DDH}$. The gates of PMOS transistors 106 and 108 are coupled to a low voltage source ($V_{DDL}$) as are the gates of NMOS transistors 110 and 112. NMOS transistor 114 is coupled to NMOS transistor 110 and to ground. The gate of NMOS transistor 114 is coupled to an input of inverter 118 and to port 120, which may be coupled to an output of a pre-driver core device (not shown) having an operational voltage equal to $V_{DDL}$. NMOS transistor 116 is coupled to PMOS transistor 112 and to ground. The gate of NMOS transistor 116 is coupled to the output of the inverter 118.

In operation, the level shifting circuit 100 receives a signal having a voltage between ground and $V_{DDL}$ at port 120 and in response outputs a signal having a voltage between the voltage of the high voltage source $V_{DDH}$ and a voltage equal to $V_{DDL}$ plus the turn on voltage of the PMOS transistors ($V_{TP}$) at port 122. FIG. 1B is a voltage versus time graph showing the voltage at node 124 and the voltage at point X in FIG. 1A. As shown in FIG. 1B, the voltage at node 124 is initially at the voltage potential of $V_{DDH}$, which is approximately 3.62 volts with respect to ground. At the same time, the voltage at point X, which is disposed between PMOS transistor 106 and NMOS transistor 110, is at the voltage potential of $V_{DDL}$, which is approximately 1.62 volts with respect to ground. At the 10 ns mark, the voltage at node 124 transitions from $V_{DDH}$ to $V_{DDL}$, and the voltage at point X transitions from $V_{DDL}$ to ground. At the 20 ns mark, the voltage at node 124 transitions back to $V_{DDH}$ from $V_{DDL}$, and the voltage at point X transitions from ground to $V_{DDL}$.

However, the voltage swings at node 124 and point X induce hot carrier effects (HCEs) in certain devices of the circuit 100. For example, FIG. 1C is a voltage versus time graph illustrating the drain-source voltage ($V_{DS}$) and the gate-source voltage ($V_{GS}$) for the NMOS transistor 110 in FIG. 1 as the voltages at node 124 and point X transition in accordance with FIG. 1B. As shown in FIG. 1C, the $V_{DS}$ of NMOS transistor 110 experiences a peak voltage of approximately 2.7 volts each time the voltage at point X transition to and from ground. These voltage spikes of approximately 2.7 volts reduce the reliability of the device due to HCEs that result in device degradation and instability of the circuit. Additionally, additional circuitry is needed to level the output voltages to $V_{DDL}$ and $V_{DDH}$ from the output swing of $V_{DDL}+V_{TP}$ and $V_{DDH}$ thereby increasing the complexity and expense of the integrated circuit.

Another example of a level shifter is disclosed in U.S. Pat. No. 7,151,391 issued to Chen et al. titled "Integrated Circuit for Level-Shifting Voltage Levels". The level circuit in Chen et al. includes two cascode inverter amplifiers coupled to an output stage. Like the level shifting circuit 100 illustrated in FIG. 1, the level shifting circuit disclosed by Chen et al. suffers from large voltage spikes that induce HCEs in some of the devices in the circuit. Additionally, both circuits have slow operational speeds due to the complexity of the level shifting circuits illustrated in FIG. 1 disclosed by Chen et al., which may prevent them from being implemented in high-speed applications.

Accordingly, an improved level shifter for an integrated circuit is desirable.

SUMMARY

A circuit is disclosed including first, second, and third inverters. The first inverter has a first input coupled to a first port and a first output coupled to a second port. The second inverter has a second input coupled to the second port and a second output coupled to the first port. The third inverter has a third input coupled to the first port through a first capacitor and to a third port. The third inverter has an output coupled to the second port through a second capacitor. The circuit receives a signal having a voltage between a first voltage potential and a second voltage potential and in response outputs a signal having a voltage between the second voltage potential and a third voltage potential. The third voltage potential is higher than the first and second voltage potentials with respect to ground.

A circuit including first, second, and third ports and first, second, and third inverters is also disclosed. The first inverter includes a first PMOS transistor having a first source coupled to a first voltage source node set at a first voltage potential. A first drain is coupled to the second port, and a first gate is coupled to the first port. A first NMOS transistor has a second source coupled to a second voltage source node set at a second voltage potential that is approximately one-half the first voltage potential with respect to ground. A second drain is coupled to the second port, and a second gate is coupled to the first port. The second inverter has an input coupled to the second port and an output coupled to the first port. The third inverter has a second input coupled to the first port through a first capacitor and to the third port. The third inverter has a second output coupled to the second port through a second capacitor. The circuit outputs a voltage having a potential equal to the first voltage potential when a voltage having a third voltage is received at the third port. The third voltage potential is less than the first and second voltage potentials with respect to ground. The circuit outputs a voltage having a potential equal to the second voltage potential when a voltage having the second voltage potential is received at the third port.

A level shifting circuit is disclosed that includes first, second, and third ports and first, second, and third inverters. The first PMOS transistor has a first source coupled to a first voltage source node set at a first voltage potential, a first drain coupled to the second port, and a first gate coupled to the first port. The first NMOS transistor has a second source coupled to a second voltage source node set at a second voltage potential that is approximately one-half the voltage potential of the first voltage source node with respect to ground, a second drain coupled to the second port, and a second gate coupled to the first port. The second inverter includes a second PMOS transistor having a third source coupled to the first voltage source node, a third drain coupled to the first port, and a third gate coupled to the second port. A second NMOS transistor has a fourth source coupled to the second voltage source node, a fourth drain coupled to the first port, and a fourth gate coupled to the second port. The third inverter has an input coupled to the first port through a first capacitor and to the third port. The third inverter has an output coupled to the second port through a second capacitor. The circuit outputs a voltage having a potential approximately equal to the first voltage potential at the second port in response to receiving a voltage potential approximately equal to ground at the third port. The circuit outputs a voltage having a potential approximately equal to the second voltage potential at the second port in response to receiving a voltage potential approximately equal to the second voltage potential at the third port.

DETAILED DESCRIPTION

Figure 2B:
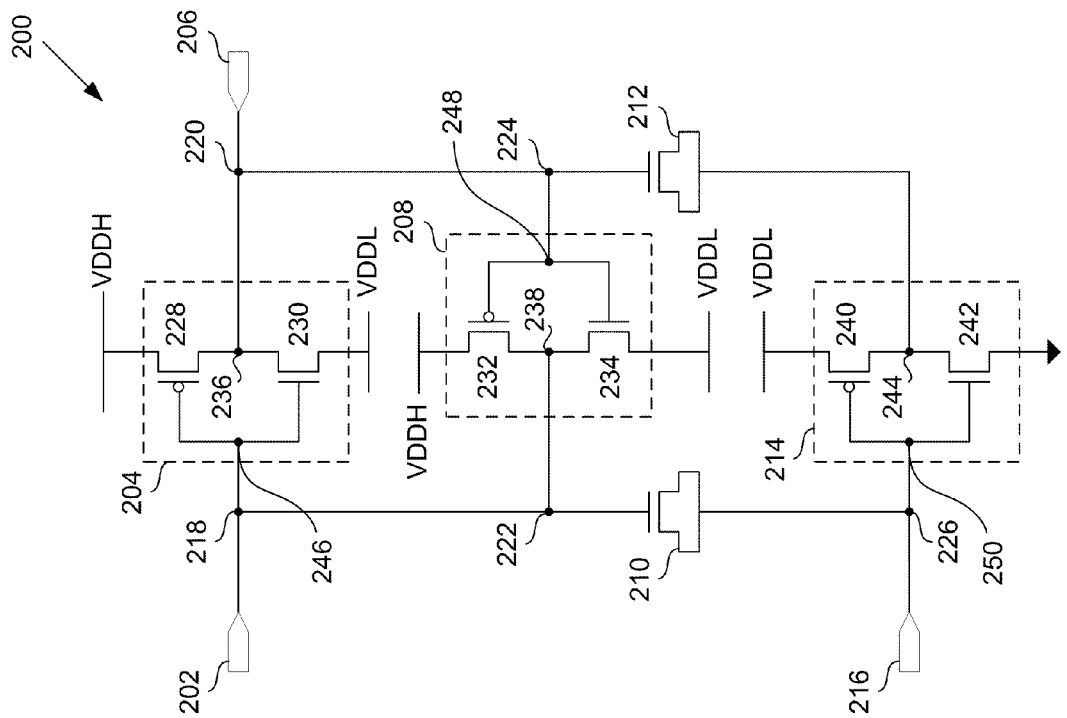
FIG. 2B is a more detailed schematic illustration of the improved voltage shifting circuit illustrated in FIG. 2A
Figure 2A:
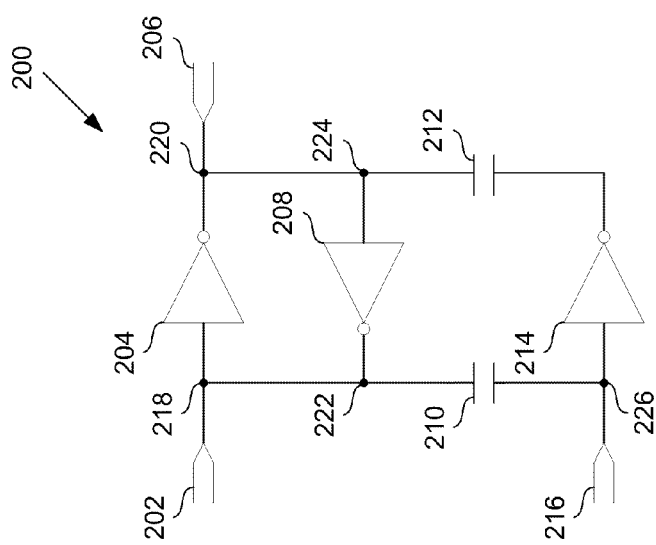
FIG. 2A is a schematic illustration of one example of an improved voltage shifting circuit.

FIG. 2A illustrates one example of an improved level shifter 200. The level shifter 200 includes inverters 204 and 208 forming a latch coupled to capacitors 210 and 212, which are also respectively coupled to an input and an output of a third inverter 214. The circuit is configured to receive a signal from a core circuit having a first operating voltage and output a signal having a voltage that is approximately twice the voltage of the core circuit to drive another circuit.

As shown in FIG. 2A, an input of inverter 204 is coupled to node 218, which is coupled to port 202 and to node 222. Port 202 may be an input/output (I/O) port coupled to a circuit or chip having an operating voltage at $V_{DDL}$ and $V_{DDH}$ in which $V_{DDH}$ is approximately twice $V_{DDL}$. For example, $V_{DDL}$ may have a voltage of approximately 1 volt with respect to ground and $V_{DDH}$ has a voltage of approximately 1.8 volts with respect to ground. Other example voltages for $V_{DDL}$ include, but are not limited to, approximately 1.2 volts and 1.8 volts with $V_{DDH}$ have voltages of approximately 2.5 volts and 3.3 volts, respectively. One skilled in the art will understand that $V_{DDL}$ and $V_{DDH}$ may have other voltages with respect to ground.

An output of inverter 204 is coupled to node 220, which is coupled to I/O port 206. I/O port 206 may also be coupled to a circuit having an operating voltage of $V_{DDH}$. Node 224 is coupled to node 220, to an input of inverter 208, and to an output of inverter 214 through capacitor 214. An output of inverter 208 is coupled to node 222, which is also coupled to node 226 through capacitor 210. Node 226 is coupled to a port 216 and to an input of inverter 214. Port 216 is an I/O port connected to a circuit having operating voltages between ground and $V_{DDL}$.

Inverters 204, 208, and 214 may be implemented as complementary metal oxide semiconductor (CMOS) inverters as illustrated in FIG. 2B with each of the devices, e.g., transistors and capacitors, being implemented with the same gate oxide thickness as the circuit coupled to port 216. Inverters 204, 208, and 214 may also be implemented using binary junction transistors (BJTs) or other transistor types as will be understood by one skilled in the art. As shown in FIG. 2B, inverter 204 may include PMOS transistor 228 and NMOS transistor 230 having their gates tied together and to node 246, which serves as the input for inverter 204. Node 236 is disposed between PMOS 228 and NMOS 230 and functions as the output of the inverter 204. PMOS transistor 228 has its source coupled to a high voltage source node ($V_{DDH}$), and NMOS transistor 230 has its source coupled to the low voltage source node ($V_{DDL}$).

Inverter 208 includes PMOS transistor 232, which as its source coupled to $V_{DDH}$, and NMOS transistor 234 having its source coupled to $V_{DDL}$. The gates of PMOS transistor 232 and NMOS transistor 234 are coupled together at node 248, which serves as the input to inverter 208. The drains of PMOS transistor 232 and NMOS transistor 234 are coupled together at node 238, which functions as the output for the inverter 208.

Inverter 214 includes PMOS transistor 240 having its source coupled to $V_{DDL}$ and NMOS transistor 242 having its source coupled to ground. The drains of PMOS transistor 240 and NMOS transistor 242 are coupled together at node 244, which functions as the output of inverter 214. The gates of PMOS transistor 240 and NMOS transistor 242 are coupled together at node 250, which serves as the input for inverter 214.

Capacitors 210 and 212 may be implemented as NMOS transistors having their gates respectively coupled to nodes 222 and 224, although one skilled in the art will understand that capacitors 210, 212 may have other implementations. The sources and drains of the NMOS forming capacitor 210 are coupled together and to node 226. The sources and drains of NMOS forming capacitor 212 are also coupled together and to the output of inverter 214.

Figure 3A:
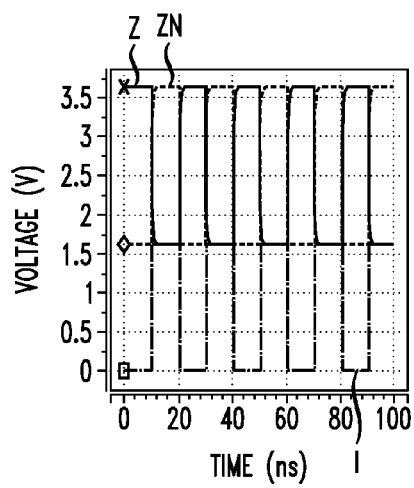
FIG. 3A is a voltage versus time graph illustrating the voltages of each of the ports of the voltage shifting circuit illustrated in FIG. 2B.

In operation, the voltage shifter 200 receives a signal at port 216 from a core circuit (not shown) having operating voltages between ground and $V_{DDL}$ and in response outputs signals at ports 202 and 206 to a circuit having operating voltages between $V_{DDL}$ and $V_{DDH}$. For example, FIG. 3A is a voltage versus time graph from a simulation of the voltage shifting circuit 200 illustrated in FIG. 2B. The line I in FIG. 3A corresponds to the voltage at port 216, the line ZN corresponds to the voltage at port 202, and line Z corresponds to the voltage at port 206. At time zero, the voltage at port 216 is at ground potential, the voltage at port 202 is equal to the voltage of $V_{DDL}$ (approximately 1.62 volts), and the voltage at port 206 is equal to the voltage of $V_{DDH}$ (approximately 3.62 volts).

Figure 3C:
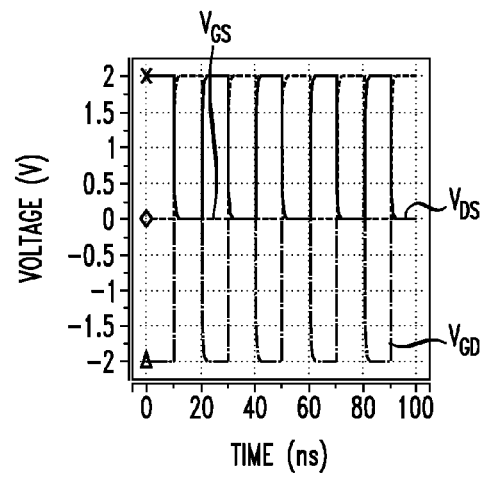
FIG. 3C is a voltage versus time graph of the gate-drain voltage, the drain-source voltage, and the gate-source voltage for an NMOS transistor of an inverter in accordance with the voltage shifting circuit illustrated in FIG. 2B.
Figure 3B:
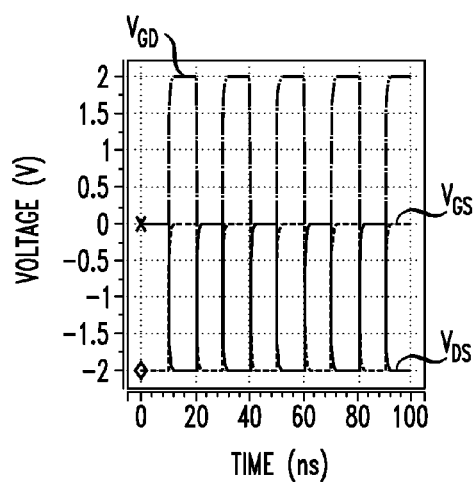
FIG. 3B is a voltage versus time graph of gate-drain voltage, the drain-source voltage, and the gate-source voltage for a PMOS transistor of an inverter in accordance with the voltage shifting circuit illustrated in FIG. 2B.
Figure 3D:
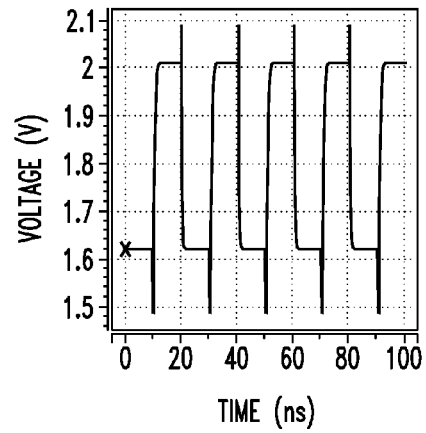
FIG. 3D is a voltage versus time graph of the gate-source voltage of the NMOS transistor configured to form a capacitor in accordance with the voltage shifting circuit illustrated in FIG. 2B.

FIGS. 3B and 3C respectively illustrate simulation data for the gate-source voltage ($V_{GS}$), the gate-drain voltage ($V_{GA}$), and the drain-source voltage ($V_{DS}$) of the PMOS and NMOS transistors 228, 230 as the voltage shifter 200 operates in accordance with FIG. 3A. FIG. 3D illustrates the $V_{GS}$ of the NMOS transistor configured as the capacitor 210 in FIG. 2B. As shown in FIG. 3B, when port 202 is at $V_{DDL}$ and port 206 is at $V_{DDH}$ at time zero, PMOS transistor 228 has a $V_{GS}$ of approximately −2 volts (i.e., 1.62 volts-3.62 volts) as port 202 is coupled to the gate of PMOS transistor 204. A $V_{GS}$ turns PMOS transistor 228 to an 'on' state resulting in $V_{DDH}$ (i.e., approximately 3.62 volts) being coupled to node 236. Accordingly, PMOS transistor 228 has a $V_{DS}$ of approximately zero volts as both its drain and source of PMOS transistor 228 are at approximately 3.62 volts ($V_{DDH}$).

Also at time zero, NMOS transistor 230 of inverter 204, which has its gate coupled to the input port 202 set at $V_{DDL}$ and its source coupled to $V_{DDL}$, has a $V_{GS}$ of approximately zero volts as shown in FIG. 3C. NMOS transistor 230 is in an 'off' state with a $V_{GS}$ of zero volts. Consequently, NMOS transistor 230 has a $V_{GD}$ of approximately −2 volts and a $V_{DS}$ of approximately 2 volts. Capacitor 210 implemented as an NMOS transistor has a $V_{GS}$ of approximately 1.62 volts since its drain and source are tied to ground and its gate is at 1.62 volts as seen in FIG. 3D.

At the 10 ns mark, port 216 transitions from ground to $V_{DDL}$ increasing the voltage across capacitor 210, which drives up the voltage at nodes 222 and 218. The increase in voltage at node 218 causes PMOS transistor 228 to have a $V_{GS}$ of approximately zero volts as shown in FIG. 3B resulting in PMOS transistor 228 turning off. At the same time NMOS transistor 230 has a $V_{GS}$ of approximately 2 volts as shown in FIG. 3C resulting in NMOS transistor 230 turning on and coupling $V_{DDL}$ to node 220. Consequently, port 206 transitions from $V_{DDH}$ to $V_{DDL}$ and is aided in the transition by capacitor 212 pulling down the voltage at node 224. With node 224 at $V_{DDL}$, PMOS transistor 232 turns on and NMOS transistor turns off coupling $V_{DDH}$ to node 222.

With NMOS transistor 230 on, the voltage source node $V_{DDL}$ is coupled to node 236, and NMOS transistor 230 has a $V_{DS}$ voltage of approximately zero volts. With node 236 at $V_{DDL}$, PMOS transistor 228 has a $V_{DS}$ of approximately −2 volts and a $V_{GD}$ of approximately 2 volts, and NMOS transistor 230 has a $V_{GD}$ of approximately 2 volts. Capacitor 210 experiences a quick decrease in its $V_{GS}$ to approximately 1.5 volts followed by a rapid increase to 2 volts as port 216 transitions from ground to $V_{DDL}$ and port 202 transitions from $V_{DDL}$ to $V_{DDH}$ as shown in FIG. 3D.

At the 20 ns mark, port 216 transition from $V_{DDL}$ to ground and port 202 transitions from $V_{DDH}$ to $V_{DDL}$ causing port 206 to transition from $V_{DDL}$ to $V_{DDH}$ as seen in FIG. 3A. Accordingly, the $V_{GS}$, $V_{GS}$, and $V_{DS}$ values of the PMOS transistor 228 and the NMOS transistor 230 of inverter 204 transition back to their values at time zero as illustrated in FIGS. 3B and 3C and described above. The $V_{GS}$ of NMOS transistor forming capacitor 210 also transitions back its value of approximately 1.62 volts after quickly spiking to approximately 2.07 volts as illustrated in FIG. 3D. This 2.07 volt spike is the maximum voltage a device in the voltage shifting circuit 200 experiences, which is significantly lower than the maximum voltage experienced across a device in the conventional voltage shifting circuits described above. The lower voltage across the devices in the improved level shifting circuit 200 results in improved reliability for a wide variety of process, voltage, and temperature conditions.

Figure 1A:
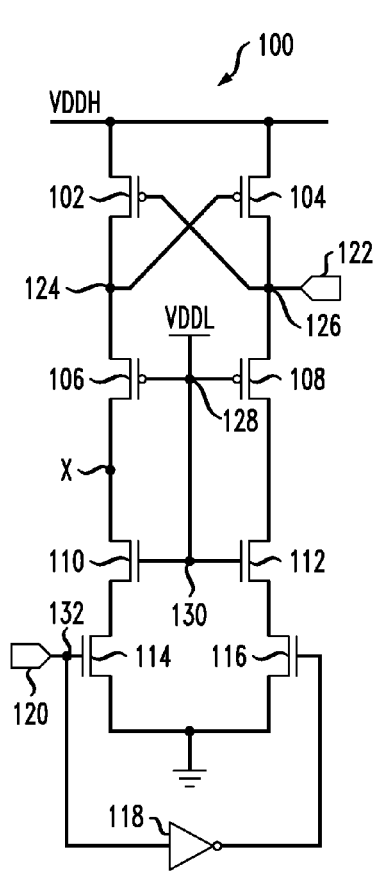
FIG. 1A illustrates one example of a conventional voltage shifter circuit.
Figure 1B:
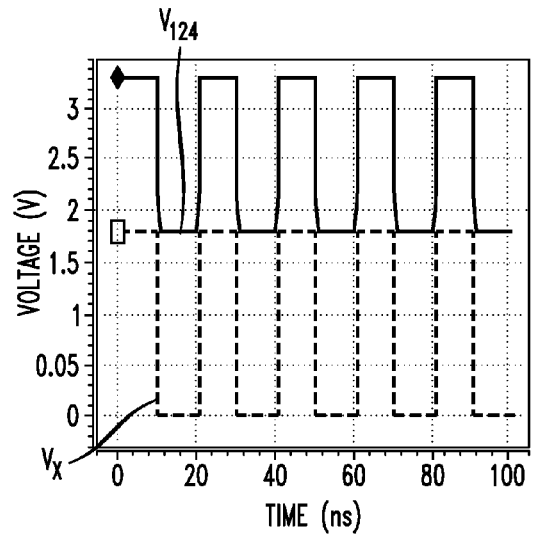
FIG. 1B is a voltage versus time graph showing the voltage transitions at different points in the conventional voltage shifting circuit illustrated in FIG. 1A.
Figure 1C:
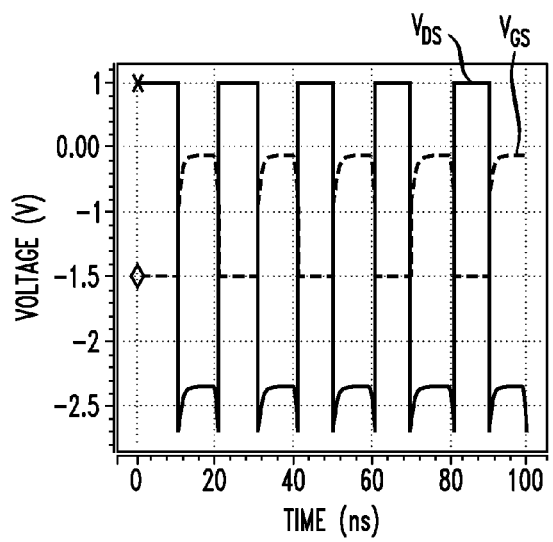
FIG. 1C is a voltage versus time graph showing the voltage transitions across a device of the voltage shifting circuit illustrated in FIG. 1A.

Additionally, the improved voltage level shifter 200 has shorter propagation delay times compared to the conventional level shifting 100 described above and disclosed by Chen et al. due to the reduced number of devices in the circuit. For example, the improved voltage level shifting circuit 200 has a delay time of approximately 8.29e-10 seconds when transitioning from a low voltage to a high voltage, which is shorter than the delay time of 1.10e-9 seconds for the circuit 100 illustrated in FIG. 1A and a delay time of 1.76e-9 seconds for the circuit disclosed by Chen et al. Additionally, the delay time for the circuit 200 to transition from a high voltage to a low voltage is approximately 8.57e-10 seconds, which is shorter than the 1.00e-9 seconds for the circuit 100 illustrated in FIG. 1A and the 1.20e-9 seconds it takes the circuit disclosed by Chen et al. Accordingly, the improved level shifting circuit 200 advantageously provides more reliable performance and faster switching time than conventional level shifting circuits.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A circuit, comprising:
   a first inverter having a first input coupled to a first port and a first output coupled to a second port;
   a second inverter having a second input coupled to the second port and a second output coupled to the first port; and
   a third inverter having a third input directly coupled to a first capacitor and to a third port, the third inverter having an output directly coupled to a second capacitor, the first capacitor directly coupled to the first port, and the second port through a directly coupled to the second capacitor,
   wherein the circuit is configured to receive a voltage between a first voltage potential and a second voltage potential at the third port and in response provide a voltage between the second voltage potential and a third voltage potential to at least one of the first and second ports, the third voltage potential higher than the first and second voltage potentials with respect to ground.

2. The circuit of claim 1, wherein the first inverter includes:
   a first PMOS transistor having a source coupled to a first voltage source node set at the third voltage potential, a drain coupled to the second port, and a gate coupled to the first port; and
   a first NMOS transistor having a source coupled to a second voltage source node set at the second voltage potential, a drain coupled to the second port, and a gate coupled to the first port.

3. The circuit of claim 1, wherein the second inverter includes:
   a first PMOS transistor having a source coupled to a first voltage source node set at the third voltage potential, a drain coupled to the first port, and a gate coupled to the second port; and
   a first NMOS transistor having a source coupled to a second voltage source node set at the second voltage potential, a drain coupled to the first port, and a gate coupled to the second port.

4. The circuit of claim 1, wherein the first capacitor includes a first NMOS transistor having a first gate coupled to the first port and a first drain directly coupled to a first source, to the input of the third inverter, and to the third port.

5. The circuit of claim 1, wherein the second capacitor includes a second NMOS transistor having a second gate coupled to the second port and a second drain directly coupled to a second source and to the output of the third inverter.

6. The circuit of claim 1, wherein the first voltage potential is ground, the second voltage potential is an operational voltage of a first circuit, and the first voltage potential is an operational voltage of a second circuit.

7. The circuit of claim 1, wherein the third voltage potential is approximately equal to twice the second voltage potential relative to ground.

8. The circuit of claim 1, wherein each of the transistors and capacitors are formed using complementary metal oxide semiconductor (CMOS) technology.

9. A circuit, comprising:
   first, second, and third ports;
   a first inverter including
      a first PMOS transistor having a first source coupled to a first voltage source node set at a first voltage potential, a first drain coupled to the second port, and a first gate coupled to the first port,
      a first NMOS transistor having a second source coupled to a second voltage source node set at a second voltage potential that is approximately one-half the first voltage potential with respect to ground, a second drain coupled to the second port, and a second gate coupled to the first port;
   a second inverter having an input coupled to the second port and an output coupled to the first port; and
   a third inverter having a second input directly coupled to a first capacitor and to the third port, the third inverter having a second output directly coupled to a second capacitor, the first capacitor directly coupled to the first port, and the second capacitor directly coupled to the second port,
   wherein one of the first and second ports has the first voltage potential when a voltage at the third port has a third voltage potential, the third voltage potential being less than the first and second voltage potentials with respect to ground, and
   wherein one of the first and second ports has the second voltage potential when a voltage at the third port has the second voltage potential.

10. The circuit of claim 9, wherein the second inverter includes
   a second PMOS transistor having a third source coupled to the first voltage source node, a third drain coupled to the first port, and a third gate coupled to the second port; and
   a second NMOS transistor having a fourth source coupled to the second voltage source node, a fourth drain coupled to the first port, and a fourth gate coupled to the second port.

11. The circuit of claim 9, wherein the first capacitor includes a second NMOS transistor having a third gate coupled to the first port and a third drain directly coupled to a third source, to the input of the third inverter, and to the third port.

12. The circuit of claim 9, wherein the second capacitor includes a second NMOS transistor having a third gate coupled to the second port and a third drain directly coupled to a third source and to the output of the third inverter.

13. The circuit of claim 9, wherein the third voltage potential is ground.

14. The circuit of claim 10, wherein the third inverter includes
   a third PMOS transistor having a fourth source coupled to the second voltage source node, a fourth drain directly coupled to the second capacitor, and a fourth gate directly coupled to the third port; and
   a third NMOS transistor having a fifth source coupled to ground, a fifth drain directly coupled to the second capacitor, and a fifth gate directly coupled to the third port.

15. The circuit of claim 14, wherein the second capacitor includes a fourth NMOS transistor having a sixth gate directly coupled to the second port and a sixth drain directly coupled to a sixth source and to the fourth and fifth drains.

16. A level shifting circuit, comprising:
   first, second, and third ports;
   a first inverter including
      a first PMOS transistor having a first source coupled to a first voltage source node set at a first voltage potential, a first drain coupled to the second port, and a first gate coupled to the first port,
      a first NMOS transistor having a second source coupled to a second voltage source node set at a second voltage potential that is approximately one-half the voltage potential of the first voltage source node with respect to ground, a second drain coupled to the second port, and a second gate coupled to the first port;
   a second inverter including
      a second PMOS transistor having a third source coupled to the first voltage source node, a third drain coupled to the first port, and a third gate coupled to the second port,
      a second NMOS transistor having a fourth source coupled to the second voltage source node, a fourth drain coupled to the first port, and a fourth gate coupled to the second port; and
   a third inverter having an input directly coupled to a first capacitor and to the third port, the third inverter having an output directly coupled to a second capacitor, the first capacitor directly coupled to the first port, and the second capacitor directly coupled to the second port,
   wherein the second port is at approximately the first voltage potential when a voltage at the third port has a voltage potential approximately at ground potential, and
   wherein the second port is at approximately the second voltage potential when a voltage at the third port has a voltage potential of approximately the second voltage potential.

17. The circuit of claim 16, wherein the first capacitor includes a third NMOS transistor having a fifth gate directly coupled to the first port and a fifth drain directly coupled to a fifth source, to the input of the third inverter, and to the third port.

18. The circuit of claim 16, wherein the second capacitor includes a third NMOS transistor having a fifth gate directly coupled to the second port and a fifth drain directly coupled to a fifth source and to the output of the third inverter.

19. The circuit of claim 16, wherein the third inverter includes
   a third PMOS transistor having a fifth source coupled to the second voltage source node, a fifth drain coupled to an output node, and a gate coupled to an input node; and
   a third NMOS transistor having a sixth source coupled to ground potential, a sixth drain coupled to the output node, and a gate coupled to the input node.

20. The circuit of claim 19, wherein each of the transistors in the circuit has approximately the same oxide thickness.

* * * * *